United States Patent [19]

Sato

[11] 4,093,993
[45] June 6, 1978

[54] BIT-SLICE TYPE LARGE SCALE INTEGRATED CIRCUIT WITH MULTIPLE FUNCTIONS ON A ONE-CHIP SEMICONDUCTOR DEVICE

[75] Inventor: Kazuyuki Sato, Koganei, Japan
[73] Assignee: Tokyo Shibaura Electric Co., Ltd., Japan
[21] Appl. No.: 718,400
[22] Filed: Aug. 27, 1976
[30] Foreign Application Priority Data
    Aug. 28, 1975 Japan .................................. 50-104239
[51] Int. Cl.² ............................................. G06F 1/00
[52] U.S. Cl. .................................... 364/712; 364/900
[58] Field of Search ............... 235/152, 156, 159, 160, 235/164; 340/172.5; 445/1; 364/200, 900, 712

[56] References Cited
U.S. PATENT DOCUMENTS

| | | | |
|---|---|---|---|
| 3,737,866 | 6/1973 | Gruner | 340/172.5 |
| 3,800,129 | 3/1974 | Umstattd | 235/156 |
| 3,878,514 | 4/1975 | Faber | 340/172.5 |
| 3,984,670 | 10/1976 | Erickson | 235/156 |
| 4,010,449 | 1/1977 | Faggin et al. | 340/172.5 |

*Primary Examiner* — David H. Malzahn
*Attorney, Agent, or Firm* — Oblon, Fisher, Spivak, McClelland & Maier

[57] ABSTRACT

Various kinds of control circuits and gate circuits are integrated on a one-chip semiconductor device to make up a bit-slice type large scale integrated circuit (LSI) with multiple functions. The gate circuits are connected with the control circuits for selecting input and output signal lines. Selecting signals are supplied to the gate circuits through the selecting lines. The gate circuits select the connection between the control circuits and the input and output lines in response to the selecting signals. The one-chip semiconductor device is particularly efficient in that it provides multiple functions without increasing the number of required terminals pins thereof.

5 Claims, 4 Drawing Figures

BIT-SLICE TYPE LARGE SCALE INTEGRATED CIRCUIT WITH MULTIPLE FUNCTIONS ON A ONE-CHIP SEMICONDUCTOR DEVICE

BACKGROUND OF THE INVENTION

1. Field of the Invention

This invention relates to a large scale integrated circuit (LSI) and, more particularly, to a bit-slice type large scale integrated circuit with multiple-functions on a one-chip semiconductor device.

2. Description of the Prior Art

Arithmetic and control systems of micro-processors as is well known, may include a plurality of conventional one-chip semiconductor devices of the bit-slice type. The conventional arithmetic and control system shown in FIG. 1A comprises a plurality of one-chip semiconductor devices 3 of the bit-slice type, a control unit 2 and another device 1. The one-chip semiconductor devices 3 are, for example, registers and arithmetic logic units which may be designed as bit-slice type LSIs. The device 1 includes control logic circuits which are not bit-slice type LSIs. Therefore, the greater part of this system may not be bit-sliced.

Another conventional arithmetic and control system shown in FIG. 1B comprises an LSI 4 which includes n control units C1, C2, ..., and Cn. Each control unit, for example, C1, is divided into four kinds of control circuits C11, C12, C13 and C14. Although the control units may be designed as bit-slice type LSIs, input and output signal lines 5 necessarily require $4 \times n$ pins and lines. Thus, this LSI is also not suitable for a one-chip semiconductor device because it cannot be contained therein with the standard package.

SUMMARY OF THE INVENTION

It is accordingly one object of this invention to provide a new and improved unique microcomputer with large scale integrated circuits.

It is another object of this invention to provide a bit-slice type large scale integrated circuit with multiple functions on a one chip semiconductor device.

It is a further object of this invention to provide a bit-slice type large scale integrated circuit suitable for a micro-processor.

Briefly stated, a bit-slice type large scale integrated circuit formed on a one-chip semiconductor device comprises a plurality of control circuits with multiple functions, input and output signal lines, selecting lines, and gate circuits for selectively connecting the control circuit with the input and output signal lines in response to selecting signals through the selecting lines.

BRIEF DESCRIPTION OF THE DRAWINGS

The exact nature of this invention, as well as other objects and advantages thereof, will be readily apparent from consideration of the following specification in connection with the annexed drawings in which.

DESCRIPTION OF THE PREFERRED EMBODIMENTS

Figure 1A:
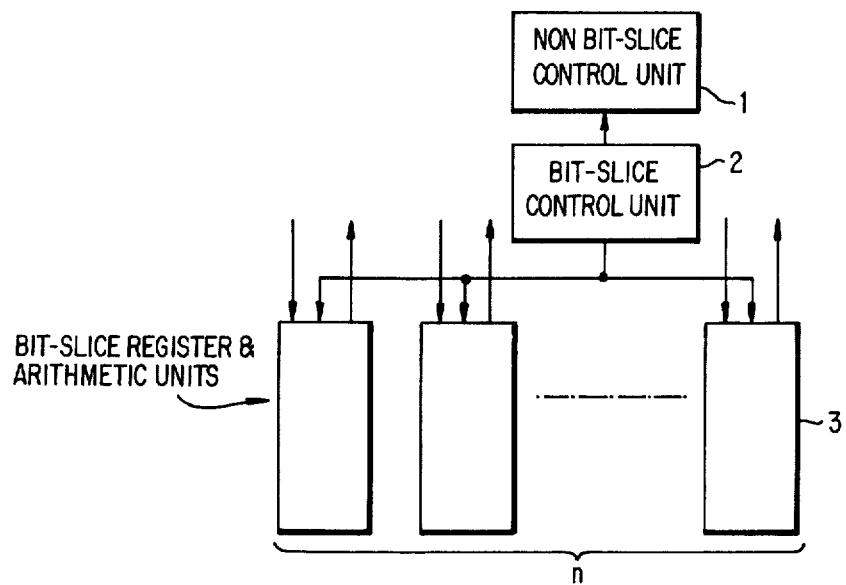
FIGS. 1A and 1B are block diagrams of prior art bit-slice type semiconductor devices.
Figure 1B:
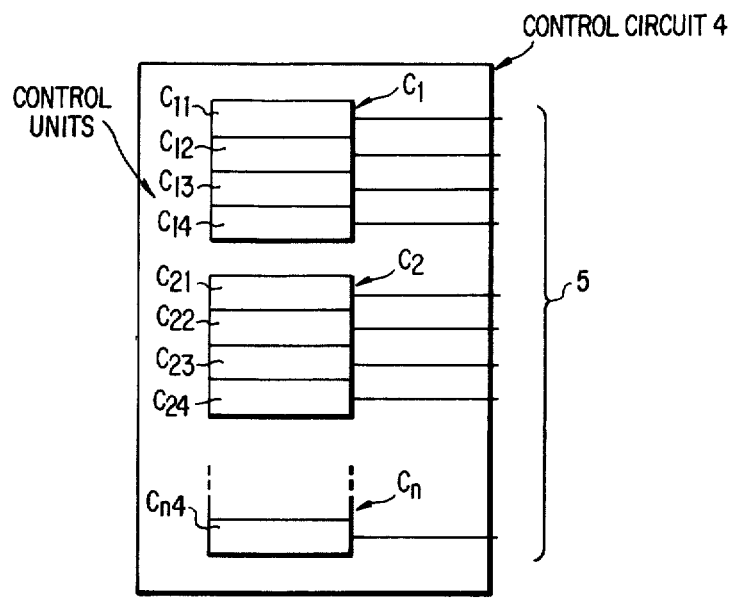
Figure 2:
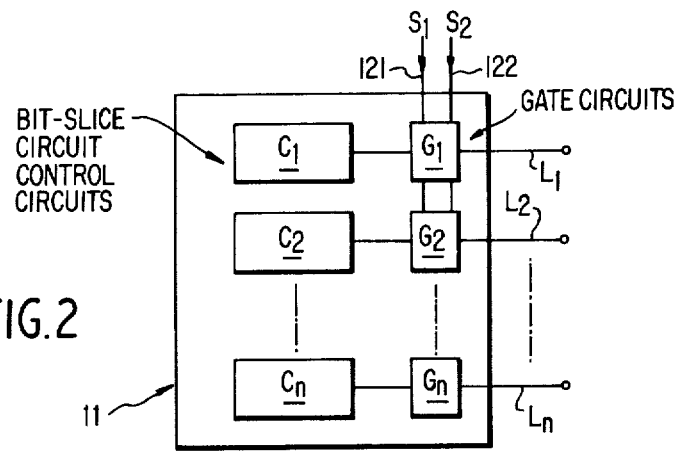
FIG. 2 is a block diagram of a bit-slice type large scale integrated circuit with multiple-functions according to this invention.

Referring now to the drawings, wherein like numerals designate identical or corresponding components, and more particularly to FIG. 2 thereof, a bit-slice type integrated circuit is shown which includes a plurality of bit-sliced circuits C1, C2, ..., and Cn. These circuits perform different functions, and may control logic circuits or control circuits for an arithmetic and control unit in a processor. The circuits (hereinafter referred to as control circuits) C1, C2, ..., and Cn are connected with gate circuits G1, G2, ..., and Gn, respectively. The gate circuits decode selecting signals S1 and S2 supplied through selecting lines 121 and 122 in order to connect the predetermined circuits of the control circuits with input and output lines L1, L2, ..., and Ln. The number X of selecting lines is determined as follows;

$$2^x \geq m, \text{ (X and } m \text{ are integers)},$$

wherein $m$ represents the number of the bit-slice functions in each of the control circuits.

Figure 3:
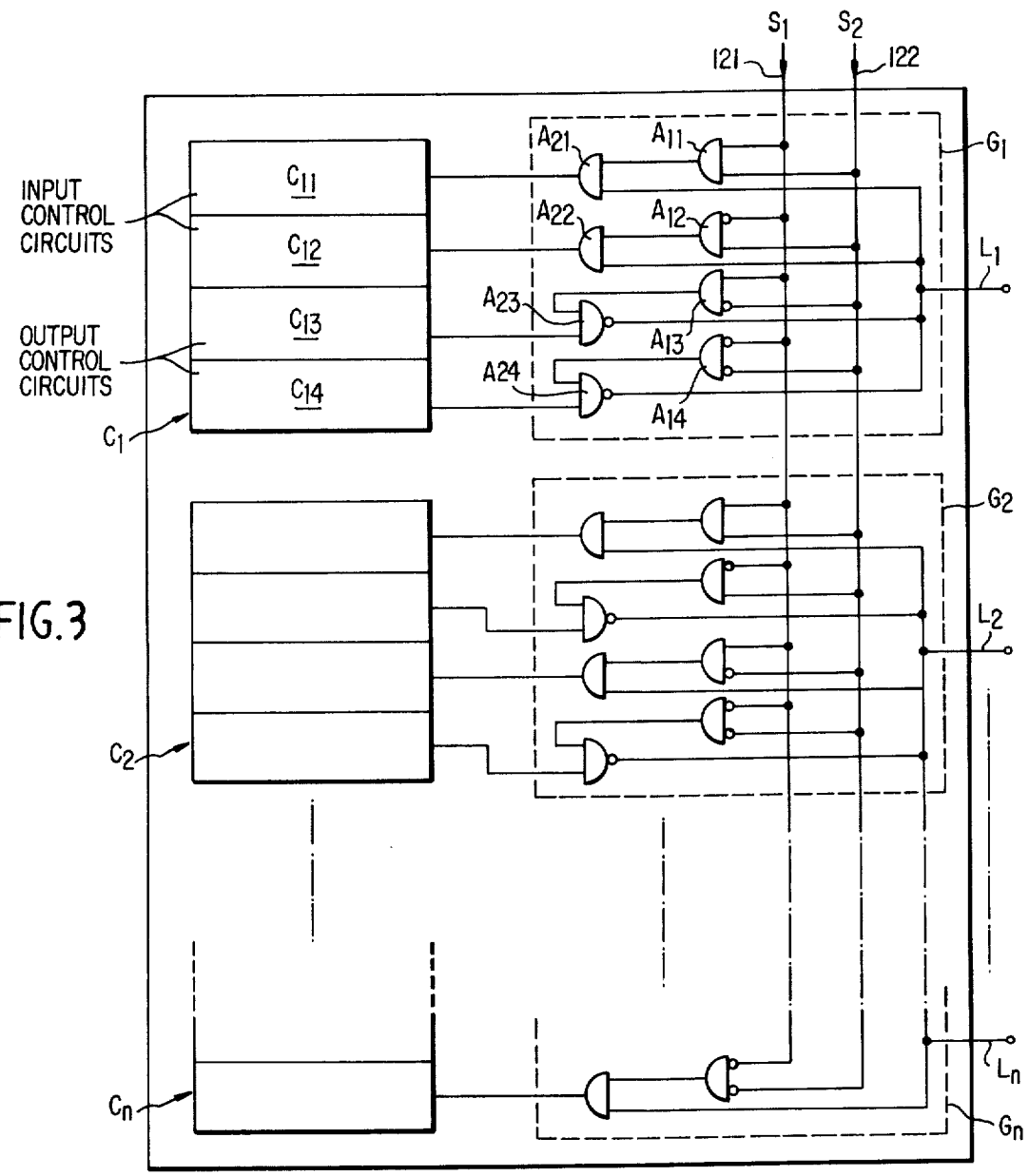
FIG. 3 is a more detailed block diagram of the bit-slice type large scale integrated circuit shown in FIG. 2.

In the large scale integrated circuit shown in FIG. 2, each of control circuits C1, C2, ..., and Cn includes four kinds of bit-slice functions therein, while the gate circuits G1, G2, ..., and Gn are supplied with two selecting signals S1 and S2, each of which is passed through the selecting lines 121 and 122, respectively. The control circuits C1, C2, ..., and Cn and the gate circuits G1, G2, ..., and Gn are shown in more detail in FIG. 3.

The control circuit C1 comprises input control circuits as the first and the second circuits C11, and C12, and output control circuits as the third and the fourth circuits C13 and C14. These circuits C11, C12, C13, and C14 are bit-sliced circuits with different functions.

The gate circuit G1 comprises AND gates A11 and A21 for the input control circuit C11, AND gates A12 and A22 for the input control circuit C12, AND gates A13 and A23 for the output control circuit C13, and AND gates A14 and A24 for the output control circuit C14.

The control circuits C2, C3, ..., and Cn are of the same configurations as those of control circuit C1 except for the different functions thereof. The gates circuits G2, G3, ..., and Gn are also of the same configurations as those of the gate circuit G1.

The AND gates A11, A12, A13, and A14 decode the selecting signals S1 and S2, and the AND gates A21, A22, A23, and A24 operate as input and output gates, wherein small circles connected to the input terminals of these AND gates signify inversion functions. The selecting lines 121 and 122 are connected to the input terminals of the AND gate A11. The output line of the AND gate A11 and the signal line L1 are connected to the input terminals of the AND gate A21 and the output line thereof is connected to the input control circuit C11.

The selecting line 121 is connected to the input terminal of the AND gate A12 through the inverter while the selecting line 122 is connected to another input terminal of the AND gate A12. The output line thereof and the signal line L1 are connected to the AND gate A22. The output line thereof is connected to the control circuit C12. The selecting line 121 is connected to the input terminal of the AND gate A13 while the selecting line 122 is connected to another input terminal of the AND gate A13 through the inverter. The output terminal of the AND gate A13 and the output line of the output control circuit C13 are connected to the AND gate A23. The output terminal thereof is connected to the signal line L1 through the invertor.

The selecting lines 121 and 122 are connected to the input terminals of the AND gate A14 through the invertors. The output terminals of the AND gate A14 and the output control circuit C14 are respectively connected to the AND gate A24. The output terminal thereof is connected to the signal line L1 through the inverter.

The operation of this large scale integrated circuit will now be explained. The gate circuits G1, G2, ..., and Gn select either the input signals to the signal lines L1, L2, ..., and Ln or the output signals therefrom as well as the connections between the predetermined circuits of each of the control circuits C1, C2, ..., and Cn and each of the signal lines L1, L2, ..., and Ln in response to the selecting signals S1 and S2. For example, when both selecting signals S1 and S2 are "1", the AND gate A11 is enabled so that the AND gate A21 accepts the output signal of the signal line L1 and supplies it to the first input control circuit C11 in the control circuit C1. The input and output signal lines L2, L3, ..., and Ln are respectively connected with the first circuits in the control circuits C2, C3, ..., and Cn through the gate circuits G2, G3, ..., and Gn in the same way. When the selecting signal S1 is "0" and another selecting signal S2 is "1", the signal lines L1, L2, ..., and Ln are respectively connected with the second circuits in the control circuits C1, C2, ..., and Cn through the gate circuits G1, G2, ..., and Gn. Under this condition, the output signal of the output control circuit C22 in the control circuit C2, for example, is supplied to the signal line L2 through the AND gate. The explanations of the selecting signals S1 and S2 "10" and "00" are omitted because those skilled in the art can easily understand the operations thereof.

While the one preferred embodiment has been explained with reference to a specific LSI, it is obvious that other LSIs may be adapted to utilize this invention in order to obtain the same advantages. For example, the AND gates A11, A12, A13, and A14 may be arranged to use in common the gate circuits G1, G2, ..., and Gn.

As described above, the LSI according to this invention includes multiple-functions therein without increasing the number of required terminal pins of the one-chip semiconductor device, and, thus, it may be contained in the standard package. More specifically, although the number of required pins of the conventional bit-slice type LSI shown in FIG. 2 is 4 × n, that of the LSI according to the present invention is n + 2. In other words, the bit-slice type LSI with multiple-functions according to this invention, is of great advantage in engineering applications as well as in that significant fabrication cost reductions are permitted.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A bit-slice type large scale integrated circuit formed on a one-chip semiconductor device comprising:
   a plurality of bit-sliced input control circuits with different functions,
   a plurality of bit-sliced output control circuits with different functions,
   gate circuits including decoding gates and input and output gates, the output terminals of said decoding gates connected with input terminals of said input and output gates for enabling said input and output gates, the output terminals of said input gates connected with said input control circuits and input terminals of said output gates connected with said output control circuits,
   signal lines connected for common use with input and output signals to and from said integrated circuit, said signal lines connected with said input and output gates; and,
   selecting lines connected with the input terminals of said decoding gates for supplying selecting signals thereto to cause said decoding gates to enable said input and output gates, whereby selected connections can be established between said input control circuits and said output control circuits and said signal lines through said input and output gates.

2. A bit-slice type large scale integrated circuit according to claim 1, wherein:
   said input control circuits and said output control circuits include control logic circuits.

3. A bit-slice type large scale integrated circuit according to claim 1, wherein:
   said input control circuits and said output circuits include arithmetic logic units.

4. A bit-slice type large scale integrated circuit according to claim 1, wherein:
   said input control circuits and said output control circuits include registers.

5. A bit-slice type integrated circuit according to claim 1, wherein:
   said decoding gates are used in common with said input and output gates.

* * * * *